US007589633B2

(12) United States Patent
Corriveau et al.

(10) Patent No.: US 7,589,633 B2
(45) Date of Patent: Sep. 15, 2009

(54) CLOSED LOOP LOCATION DETECTION SYSTEM

(75) Inventors: André Corriveau, Bromont (CA); François Monette, Bromont (CA); Vincent Dubois, Canton de Shefford (CA)

(73) Assignee: Cogiscan Inc., Montréal (CA)

( * ) Notice: Subject to any disclaimer, the term of this patent is extended or adjusted under 35 U.S.C. 154(b) by 570 days.

(21) Appl. No.: 10/544,444

(22) PCT Filed: Feb. 6, 2004

(86) PCT No.: PCT/CA2004/000154

§ 371 (c)(1), (2), (4) Date: Aug. 4, 2005

(87) PCT Pub. No.: WO2004/070484

PCT Pub. Date: Aug. 19, 2004

(65) Prior Publication Data

US 2006/0144921 A1 Jul. 6, 2006

(30) Foreign Application Priority Data

Feb. 6, 2003 (CA) .................................... 2418567
May 8, 2003 (CA) .................................... 2428442

(51) Int. Cl. *G08B 13/14* (2006.01)
(52) U.S. Cl. .................. 340/572.1; 235/385; 700/95
(58) Field of Classification Search .............. 340/572.1; 235/385; 700/95, 115, 116
See application file for complete search history.

(56) References Cited

U.S. PATENT DOCUMENTS 5,942,739 A 8/1999 Zvonar et al.
7,069,100 B2 * 6/2006 Monette et al. ............. 700/116
7,286,888 B2 * 10/2007 Monette et al. ............. 700/95
7,389,920 B2 * 6/2008 Rodgers ..................... 235/385

FOREIGN PATENT DOCUMENTS

JP 11-163591 6/1999
WO WO 01/82009 11/2001

* cited by examiner

Primary Examiner—John A Tweel, Jr.

(57) ABSTRACT

A closed loop location detection system for use in monitoring simultaneously the presence or absence of objects in at least two locations, comprises at least one detectable element per location and adapted to be associated with a respective object to be monitored, and at least one detecting device adapted to detect the detectable elements of the objects and so determine whether objects are present in, or absent form, all of the locations being monitored. Means are provided for causing an object to be fed to a location determined to be devoid of objects by the detecting device. Typically, the closed loop location detection system uses RFID technology, e.g. the detection device comprises at least one antenna and the detectable element comprising at least one RF tag. There may be provided one such antenna for each location to be monitored, whereby for a given location, a respective antenna detects the presence or absence of a respective tag thereby determining whether an object is present in this given location. Alternatively, the antenna can be adapted to monitor more than one location, wherein a position tag is associated with each location and means to deactivate the position tag are provided on each object, whereby when the object is fed to a given location, the means to deactivate that are provided on this given object, cause the position tag associated with the given location to stop being detected by the antenna thereby determining that a specific object has been fed to a specific location.

41 Claims, 2 Drawing Sheets

12 Positions Swivel Reel Rack
Front View without Reels

CLOSED LOOP LOCATION DETECTION SYSTEM

CROSS REFERENCE TO RELATED APPLICATIONS

This application is a National Entry Application of PCT Application No. PCT/CA2004/000154, filed on Feb. 6, 2004, which itself claims priority on Canadian Applications No. 2,418,567, filed on Feb. 6, 2003 and No. 2,428,442, filed on May 8, 2003. All documents above are herein incorporated by reference.

TECHNICAL FIELD

The present invention relates to automated apparatuses for handling objects and goods and, more particularly, to identification of the arrival and departure of such an object or good from a location, e.g. a feeding area, of such an automated apparatus.

BACKGROUND ART

Different equipment suppliers currently offer validation systems for their component placement equipment. These systems are designed to validate that the right component part number is used at the right feeder location for a given product to be produced. These validations systems are not fully closed loop and require some level of intervention by the operator, which can be a source of potential errors. Also, these systems are typically machine dedicated and cannot be used on machines from other equipment suppliers. Furthermore, these systems validate only the feeders for components in tape and reel and cannot deal with components in other containers, neither with other raw materials and tooling.

In PCT Publication No. WO 01/82009 published on Nov. 1, 2001 in the name of Cogiscan Inc., a line validation system disclosed, which provides the ability to validate that the right components are used at the correct location on a placement machine, but also provides a way to validate that the proper tooling, chemicals and programs are used on every machine on the assembly line. This system operates in an open loop configuration. PCT Publication No. WO 01/82009 corresponds to United States Patent Application Publication No. US 2003/0102367-A1 that was published on Jun. 5, 2003 in the names of Monette et al. and that is herein incorporated by reference.

DISCLOSURE OF INVENTION

It is therefore an aim of the present invention to provide a closed loop location detection system for identifying the arrival and departure of an object from a feeding area.

Therefore, in accordance with the present invention, there is provided a closed loop location detection system for use in monitoring simultaneously the presence or absence of objects in at least two locations, comprising at least one detectable element per location and adapted to be associated with a respective object to be monitored, and at least one detecting device adapted to detect the detectable elements of the objects and so determine whether objects are present in, or absent from, all of the locations being monitored.

Also in accordance with the present invention, there is provided a method in a closed loop for monitoring simultaneously the presence or absence of objects in at least two locations in a manufacturing process, comprising the steps of:

(a) providing at least one detectable element per location, said detectable element being associated with a respective object to be monitored;
(b) providing at least one detecting device adapted to detect the detectable elements of the objects; and
(c) determining via information gathered by said detecting device whether objects are present in, or absent from, each of the locations being monitored.

Further in accordance with the present invention, there is provided a method in a closed loop for monitoring simultaneously the presence or absence of objects in at least two locations in a manufacturing process, comprising the steps of:

(a) providing a tag for each object to be monitored;
(b) determining the presence or absence of a tag at each location; and
(c) feeding at least one object to each location where no tag was detected in step (b) and where a substitute object is desired.

Further in accordance with the present invention, there is provided a closed loop location detection system for use in monitoring simultaneously the presence or absence of feeders in at least two locations in a manufacturing process, comprising at least one detectable element per location and adapted to be associated with a respective feeder to be monitored, at least one detecting device adapted to detect the detectable elements of the feeders and so determine whether feeders are present in, or absent from, all of the locations being monitored, each feeder containing components, each component having been associated with its respective feeder, means to generate a signal when a component is removed from its feeder thereby allowing to associate a new component positioned in the feeder with this feeder.

BRIEF DESCRIPTION OF THE DRAWINGS

Having thus generally described the nature of the invention, reference will now be made to the accompanying drawings, showing by way of illustration a preferred embodiment thereof, and in which:

FIGS. 2 and 3 illustrate a second embodiment of the present invention where a locking mechanism with an integrated RF antenna is used, wherein FIG. 2 is a front view of a reel feeding rack, without the reels loaded therein, and FIG. 3 is a side view of showing one reel holder of the reel rack of FIG. 2 provided with a reel thereon and shown in up and down positions thereof; and FIGS. 4 and 5 illustrate a third embodiment of the present invention that is a variant of FIGS. 2 and 3, using a locking mechanism with an integrated switching device, wherein FIG. 4 is a front view of a reel feeding rack, without the reels loaded therein, and FIG. 5 is a side view of showing one reel holder of the reel rack of FIG. 2 provided with a reel thereon and shown in up and down positions thereof.

MODES FOR CARRYING OUT THE INVENTION

The present invention is an extension of the line validation system disclosed in afore-mentioned PCT Publication No. WO 01/82009 in that it provides a closed loop solution to the validation process. This solution includes some unique features that contribute to its value, and these features are part of the present invention.

Although a first application for this invention is component placement machine validation, there are many other applications where the present invention can be used, and some of those applications will be discussed as examples hereinbelow.

The system of the present invention uses automated means to identify the arrival and departure of an object, for example, from a feeding area. This feeding area may contain multiple locations and, through the use of this invention, it is possible to identify which location is being used.

Within the system of the present invention, the use of the Radio Frequency Identification (RFID) technology is particularly interesting and efficient. Indeed, the RFID technology provides a good way to eliminate the operator intervention, for instance, during the replacement of an empty feeder with a feeder with components.

The present system also could be used for other applications such as any other equipment that has at least one material input, any removable portion of equipment—such as feeder banks—or any storage area for material, tooling or chemicals.

More particularly, a typical component placement machine includes one or several feeding areas. Each feeding area can hold a number of feeders depending on the machine supplier in respective locations. Each feeder holds typically one component tape & reel, one or several trays of components, or one or several tubes of components. Although the following description of the system has been made specific to the case of a component placement machine with feeders containing components packaged in tape & reel format, it is readily understood that the same system is also capable of handling components packaged in trays and tubes.

Figure 1:
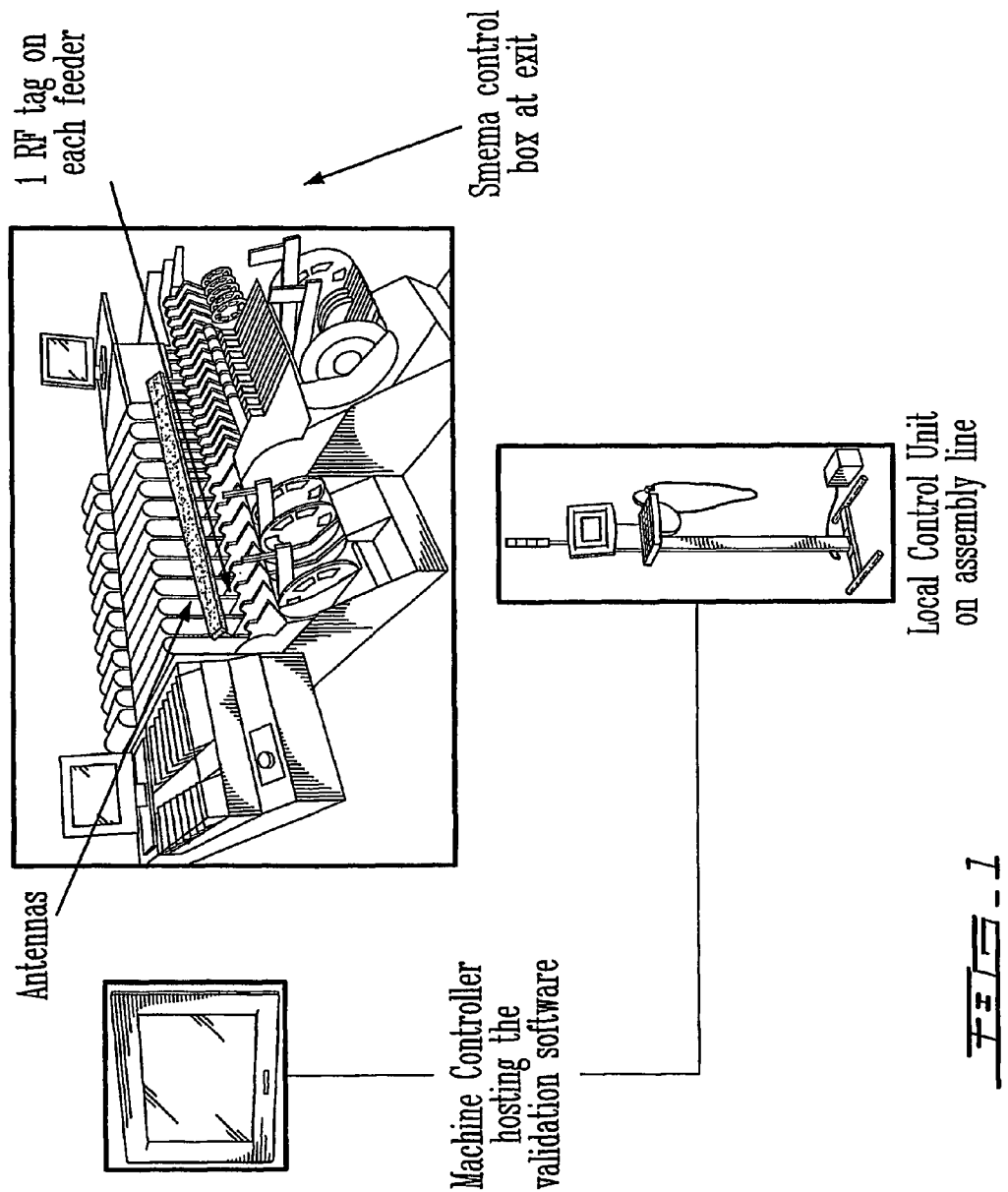
FIG. 1 is a schematic view of parts of an assembly line, including a closed loop location detection system in accordance with the present invention.

In a system in accordance with the present invention (FIG. 1), each feeder is identified with an RF tag. The feeder tag is mounted on an arm permanently or temporarily attached to the feeder. The feeder arm also incorporates a mean to deactivate one or more position tags. When a tape & reel is placed in a feeder, the component information (part number, lot number, supplier etc) is linked to the feeder tag. This operation can be done for example by a manual keyboard entry, by reading the information in barcode format or by reading a tag on the component tape & reel.

One or several antennas are located close to the feeding area, depending on the machine configuration. The antennas incorporate at least one RF tag for each possible feeder position part of a feeding area that a given antenna monitors. The feeder arm is located on the feeder in a way that when a feeder is added to the component placement machine, the corresponding antenna detects the arrival of the feeder tag and the position tag is deactivated (the feeder arm, for instance, shields the position tag from the antenna, thereby indicating that the feeder location in the component placement machine, which is associated with this position tag now contains a feeder). The association between the feeder tag that was detected and the position tag that is no longer detected by the antenna make it possible to determine that a specific feeder has arrived at a given position in the machine.

Similarly, when a feeder is removed from a component placement machine, the antenna will detect that a feeder tag has departed and will detect the position tag positioned in the location liberated by this departed feeder. The system then makes the association between the two events to determine the identity of the feeder that was removed along with the position it held in the component placement machine.

An alternative way to achieve the same goal, using RFID technology, is to use multiple antennas, one per location to be detected. In this case, each feeder, or object to be detected, is identified with one RF tag. Each location in the feeding area is fitted with an antenna. These antennas will detect the presence and the identification of the feeder tags when the objects are placed in the feeding area. The antennas will also detect the absence of feeder tags when the objects are removed. The antennas can either be read independently, or multiplexed together with one or multiple reading devices. In the example of a pick and place machine feeding trays and reels, each feeder location will have an antenna to detect the feeder tag. For the trays, either each tray location will have an antenna detecting the tray tag, either the feeding location will have an antenna reading the tag of the tray being used.

In some cases, it is not practical to put tags on the objects to be loaded in the machines. So that it does not become impossible to detect these objects when they are loaded and unloaded, a locking mechanism that needs to be unlocked prior to loading the new object and locked once it is loaded is placed in the machine. This locking mechanism will modify the state of a switching device or detect a tag when locked back in position. This will trigger an event where the new item entered in the equipment will have to be identified.

Figure 2:
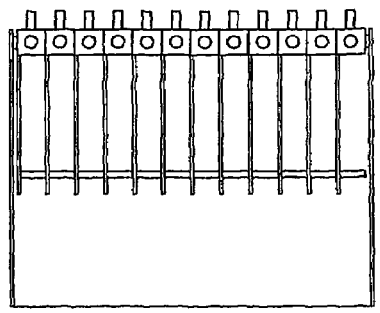
Figure 3:
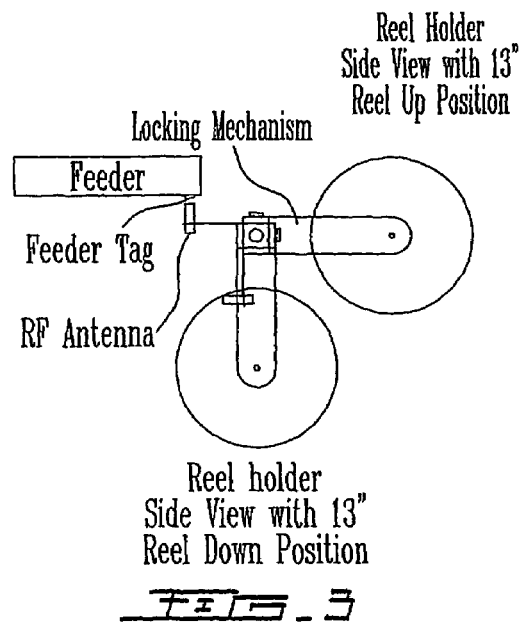

A practical example where this locking device can be used is on a Siemens pick and place machine feeding reels. The reels are placed in feeder banks and can be spliced at any time to replace any given reel by a new one, while the feeders remain in the feeder bank. In this example, one would want to validate that the right feeder is being used with the right components for a given product being assembled. One way to solve this problem would be to tag the feeders and read their identity when the locking mechanism comes back to its locked position. An operator would then be prompted to read the barcode label on the reel and the software could do the association between the reel, the feeder and the machine program being used. This configuration is showed in FIGS. 2 and 3.

Figure 4:
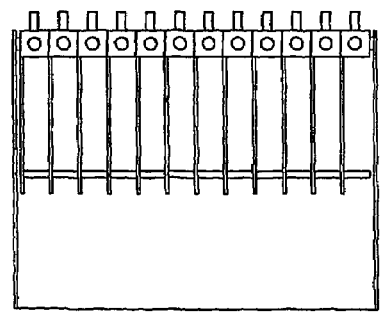
Figure 5:
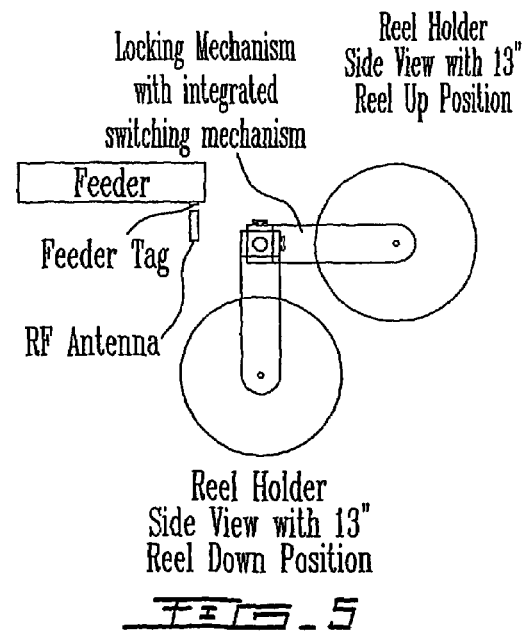

Another way to achieve the same goal would be to have a switching device integrated in the locking mechanism. This switching device will be the trigger to prompt the operator to read the new reel identity. The feeders can be identified using a tag and one of the methodologies previously discussed. This alternate configuration can be seen in FIGS. 4 and 5.

A software algorithm enables the system to validate that all the feeders containing the proper component part numbers and lot numbers are located at the appropriate feeder positions in the component placement machine against the requirement of a specific product recipe. This validation can be done during a product changeover operation or during normal production when feeders need to be replenished with components. This association between a given tool or material and a given position can also be used in many other applications, such as inventory, physical location, etc.

To illustrate the use of the present invention in another application, the present system is now described within the context of a screen printer for electronics assembly. Screen printers are used to deposit solder paste on printed circuit boards (PCB) before the components are placed thereon. In order to do so, they are fitted with a syringe of solder paste, a stencil and some other tooling like a blade and a PCB support. These elements might be specific to a given PCB part number or a family of part numbers. They can all be identified with RF tags and, using the above-described invention, their identity can be captured when they are entered in the machine. By doing so, it becomes possible to have software solutions tracking and controlling these elements, like the validation of the recipe and the gathering of traceability data.

Therefore, the invention provides a fully closed loop position monitoring system, and if desired also provided with validation features, which is independent of operator intervention (no manual scanning in most cases). The present system is not machine or equipment supplier specific and can thus be readily adapted to different types of processes, in different industries. It also provides real-time location of material and tooling, while giving the ability to perform automatic controls.

The invention claimed is:

1. A closed loop location detection system for use in monitoring simultaneously the presence or absence of objects in at least two locations in a manufacturing process, comprising at least one detectable element per location and adapted to be associated with a respective object to be monitored, and at least one detecting device adapted to detect the detectable elements of the objects and so determine whether objects are present in, or absent from, all of the locations being monitored wherein said closed loop location detection system uses RFID technology, said detection device comprising at least one antenna and said detectable element comprising at least one RF tag, and wherein said antenna is adapted to monitor more than one location, a position tag being associated with each location and means to deactivate said position tag being provided on each object, whereby when the object is fed to a given location, said means to deactivate, provided on said given object, cause said position tag associated with said given location to stop being detected by said antenna thereby determining that a specific object has been fed to a specific location.

2. A closed loop location detection system as defined in claim 1, wherein means are provided for causing an object to be fed to a location determined to be devoid of objects by said detecting device.

3. A closed loop location detection system as defined in claim 1, wherein there is provided one said antenna for each location to be monitored, whereby for a given location, a respective antenna detects the presence or absence of a respective tag thereby determining whether an object is present in said given location.

4. A closed loop location detection system as defined in claim 1, wherein validation means are provided to ensure that only an intended object is fed to a given location.

5. A closed loop location detection system as defined in claim 1, wherein validation means are provided to determine if an improper object has been fed to a location.

6. A closed loop location detection system as defined in claim 1, wherein validation means are provided for at least one of determining if an improper object has been fed to a location and of ensuring that the object in a location is as intended.

7. A closed loop location detection system as defined in claim 6, wherein said RF tag includes information about the object associated therewith, said validation means being adapted to read said information so as to identify locations having improper objects.

8. A method in a closed loop for monitoring simultaneously the presence or absence of objects in at least two locations in a manufacturing process, comprising the steps of:

(a) providing at least one detectable element per location, said detectable element being associated with a respective object to be monitored;

(b) providing at least one detecting device adapted to detect the detectable elements of the objects; and (c) determining via information gathered by said detecting device whether objects are present in, or absent from, each of the locations being monitored; wherein said detection device comprises at least one antenna and said detectable element comprises at least one RF tag, and wherein said antenna is adapted to monitor more than one location, a position tag being associated with each location and means to deactivate said position tag being associated with each object, whereby when the object is fed to a given location, said means to deactivate, associated with said given object, cause said position tag associated with said given location to stop being detected by said antenna thereby determining that a specific object has been fed to a specific location.

9. A closed loop method as defined in claim 8, wherein after step (c) at least one object is fed to each location determined to be devoid of objects in step (c).

10. A closed loop method as defined in claim 8, wherein there is provided one said antenna for each location to be monitored, whereby for a given location, a respective antenna detects the presence or absence of a respective tag thereby determining whether an object is present in said given location.

11. A closed loop method as defined in claim 8, wherein validation means are provided to ensure that only an intended object is fed to a given location.

12. A closed loop method as defined in claim 8, wherein validation means are provided to determine in step (c) if an improper object has been fed to a location.

13. A closed loop method as defined in claim 8, wherein validation means are provided for, in step (c), at least one of determining if an improper object has been fed to a location and of ensuring that the object in a location is as intended.

14. A closed loop method as defined in claim 13, wherein said RF tag includes information about the object associated therewith, said validation means being adapted to read said information so as to identify in step (c) locations having improper objects.

15. A method in a closed loop for monitoring simultaneously the presence or absence of objects in at least two locations in a manufacturing process, comprising the steps of:

(a) providing a RF tag for each object to be monitored;

(b) determining the presence or absence of a tag at each location; and (c) feeding at least one object to each location where no tag was detected in step (b) and where a substitute object is desired; wherein the objects are feeders, each feeder containing components, each component having been associated with its respective feeder, means being provided to generate a signal when a component is removed from its feeder thereby allowing to associate a new component positioned in the feeder with this feeder.

16. A closed loop method as defined in claim 15, wherein the tags in step (a) are attached to the objects.

17. A closed loop method as defined in claim 15, wherein the objects include feeders.

18. A closed loop method as defined in claim 17, wherein the feeders contain at least one of: (1) tape and reel; (2) trays; and (3) tubes.

19. A computer readable medium adapted to store computer readable instructions thereon, the computer readable instructions comprising the method of claim 8.

20. A closed loop location detection system for use in monitoring simultaneously the presence or absence of feeders in at least two locations in a manufacturing process, comprising at least one detectable element per location and adapted to be associated with a respective feeder to be monitored, at least one detecting device adapted to detect the detectable elements of the feeders and so determine whether feeders are present in, or absent from, all of the locations being monitored, each feeder containing components, each component having been associated with its respective feeder, means to generate a signal when a component is removed from its feeder thereby allowing to associate a new component positioned in the feeder with this feeder.

21. A closed loop location detection system as defined in claim 20, wherein means are provided for causing a feeder to be fed to a location determined to be devoid of feeders by said detecting device.

22. A closed loop location detection system as defined in claim 20, wherein said closed loop location detection system uses RFID technology, said detection device comprising at least one antenna and said detectable element comprising at least one RF tag.

23. A closed loop location detection system as defined in claim 22, wherein there is provided one said antenna for each location to be monitored, whereby for a given location, a respective antenna detects the presence or absence of a respective tag thereby determining whether a feeder is present in said given location.

24. A closed loop location detection system as defined in claim 22, wherein said antenna is adapted to monitor more than one location, a position tag being associated with each location and means to deactivate said position tag being provided on each feeder, whereby when the feeder is fed to a given location, said means to deactivate, provided on said given feeder, cause said position tag associated with said given location to stop being detected by said antenna thereby determining that a specific feeder has been fed to a specific location.

25. A closed loop location detection system as defined in claim 20, wherein validation means are provided to ensure that only an intended feeder is fed to a given location.

26. A closed loop location detection system as defined in claim 20, wherein validation means are provided to determine if an improper feeder has been fed to a location.

27. A closed loop location detection system as defined in claim 22, wherein validation means are provided for at least one of determining if an improper feeder has been fed to a location and of ensuring that the feeder in a location is as intended.

28. A closed loop location detection system as defined in claim 27, wherein said RF tag includes information about the feeder associated therewith, said validation means being adapted to read said information so as to identify locations having improper feeders.

29. A closed loop location detection system as defined in claim 20, wherein said means to generate a signal comprise a switching device adapted to be triggered when a component is removed from the feeder.

30. A closed loop location detection system as defined in claim 29, wherein said switching device, when triggered, is adapted to indicate the absence of a feeder.

31. A closed loop location detection system as defined in claim 29, wherein said switching device, when triggered, is independent from the detecting device.

32. A method in a closed loon for monitoring simultaneously the presence or absence of objects in at least two locations in a manufacturing process, comprising the steps of:
    (a) providing at least one detectable element per location, said detectable element being associated with a respective object to be monitored;
    (b) providing at least one detecting device adapted to detect the detectable elements of the objects; and
    (c) determining via information gathered by said detecting device whether objects are present in, or absent from, each of the locations being monitored; wherein the objects are feeders, each feeder containing components, each component having been associated with its respective feeder, means being provided to generate a signal when a component is removed from its feeder thereby allowing to associate a new component positioned in the feeder with this feeder.

33. A closed loop method as defined in claim 32, wherein said means to generate a signal comprise a switching device adapted to be triggered when a component is removed from the feeder.

34. A closed loop method as defined in claim 33, wherein said switching device, when triggered, is adapted to indicate the absence of a feeder.

35. A closed loop method as defined in claim 33, wherein said switching device, when triggered, is independent from the detecting device.

36. A closed loop method as defined in claim 15, wherein said means to generate a signal comprise a switching device adapted to be triggered when a component is removed from the feeder.

37. A closed loop method as defined in claim 36, wherein said switching device, when triggered, is adapted to indicate the absence of a feeder.

38. A closed loop method as defined in claim 36, wherein said switching device, when triggered, is independent from the detecting device.

39. A closed loop method as defined in claim 15, wherein the feeders contain at least one of: (1) tape and reel; (2) trays; and (3) tubes.

40. A computer readable medium adapted to store computer readable instructions thereon, the computer readable instructions comprising the method of claim 32.

41. A computer readable medium adapted to store computer readable instructions thereon, the computer readable instructions comprising the method of claim 15.

* * * * *